United States Patent
Nagai et al.

(10) Patent No.: US 6,964,705 B2
(45) Date of Patent: Nov. 15, 2005

(54) METHOD FOR PRODUCING SEMICONDUCTOR CRYSTAL

(75) Inventors: Seiji Nagai, Aichi (JP); Akira Kojima, Aichi (JP); Kazuyoshi Tomita, Nagoya (JP)

(73) Assignee: Toyoda Gosei Co., Ltd., Aichi (JP)

( * ) Notice: Subject to any disclaimer, the term of this patent is extended or adjusted under 35 U.S.C. 154(b) by 32 days.

(21) Appl. No.: 10/620,970

(22) Filed: Jul. 17, 2003

(65) Prior Publication Data

US 2004/0016396 A1 Jan. 29, 2004

(30) Foreign Application Priority Data

Jul. 19, 2002 (JP) ..................................... P2002-210806

(51) Int. Cl.$^7$ ......................... C30B 25/12; C30B 25/14
(52) U.S. Cl. ............................. 117/90; 117/95; 117/97; 117/103; 438/46
(58) Field of Search ............................. 117/90, 95, 97, 117/103, 84; 438/46

(56) References Cited

FOREIGN PATENT DOCUMENTS

| JP | 7-202265 | 8/1995 |
|---|---|---|
| JP | 2001-217455 | 8/2001 |
| JP | 2001-313259 | 11/2001 |
| JP | 2002-241191 | 8/2002 |
| JP | 2002-241192 | 8/2002 |
| JP | 2002-293698 | 10/2002 |
| JP | 2002-299254 | 10/2002 |
| JP | 2003-73197 | 3/2003 |

Primary Examiner—Felisa Hiteshew
(74) Attorney, Agent, or Firm—McGinn & Gibb, PLLC

(57) ABSTRACT

A seed layer as a laminate of a GaN layer (second seed layer) and an AlN buffer layer (first seed layer) is formed on a sapphire substrate. A front surface thereof is etched in the form of stripes with a stripe width (seed width) of about 5 μm, a wing width of about 15 μm and a depth of about 0.5 μm. As a result, mesa portions each shaped like nearly a rectangle in sectional view are formed. Non-etched portions each having the seed multilayer as its flat top portion are arranged at arrangement intervals of L≈20 μm. Part of the sapphire substrate is exposed in trough portions of wings. The ratio S/W of the seed width to the wing width is preferably selected to be in a range of from about ⅓ to about ⅕. Then, a semiconductor crystal A is grown to obtain a thickness of not smaller than 50 μm. The semiconductor crystal is separated from the starting substrate to thereby obtain a high-quality single crystal independent of the starting substrate. When a halide vapor phase epitaxy method is used in the condition that the V/III ratio is selected to be in a range of from 30 to 80, both inclusively, a semiconductor crystal free from cracks can be obtained.

10 Claims, 1 Drawing Sheet

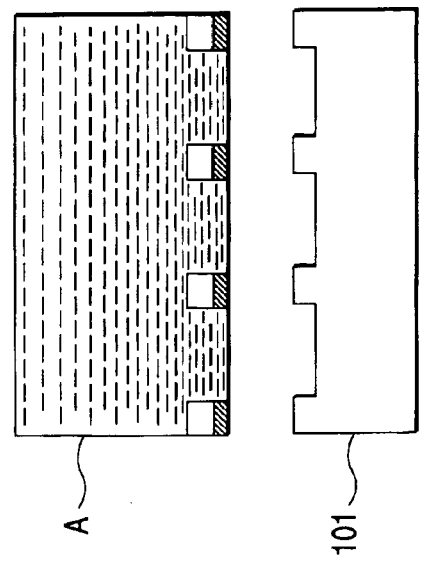
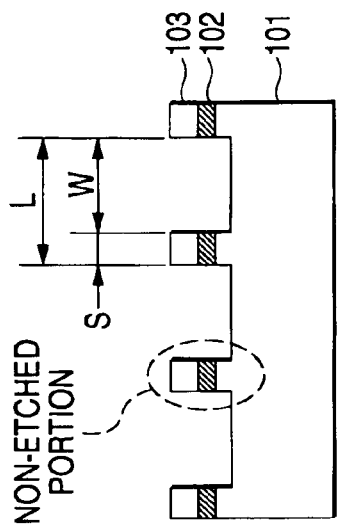
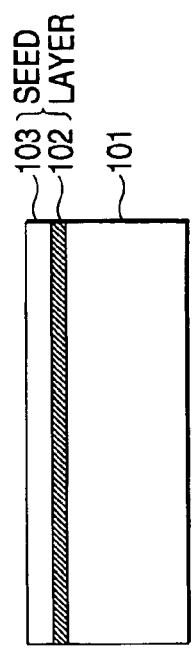
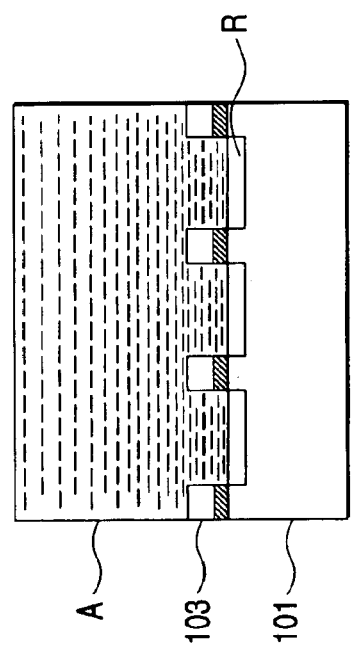

US 6,964,705 B2

METHOD FOR PRODUCING SEMICONDUCTOR CRYSTAL

The present application is based on Japanese Patent Application No. 2002-210806, which is incorporated herein by reference.

BACKGROUND OF THE INVENTION

1. Field of the Invention

The present invention relates to a method for obtaining a good-quality semiconductor crystal independent of a starting substrate by growing a semiconductor crystal of a Group III nitride compound semiconductor on the starting substrate.

The invention can be applied to production of a crystal growth substrate for various kinds of semiconductor elements such as an LED.

2. Description of the Related Art

As the related art for obtaining a semiconductor crystal independent of a starting substrate by growing a semiconductor crystal of a Group III nitride compound semiconductor on the starting substrate, there are generally known: a method using wet etching described in Unexamined Japanese Patent Publication No. Hei-7-202265: "Method for Producing Group III Nitride Semiconductor"; a method in which a sapphire substrate is removed by laser irradiation, polishing or the like after a thick GaN film (target semiconductor crystal) is grown on the sapphire substrate by an HVPE method or the like; and so on.

In the related art, there is however a problem that a large number of dislocations and cracks occur in the target single crystal because stress caused by the difference in thermal expansion coefficient or lattice constant between the starting substrate (e.g., sapphire) and the Group III nitride compound semiconductor is applied to the target single crystal (e.g., GaN) at the time of cooling or the like after the completion of the crystal growing step.

When, for example, the related art is used, the problem is as follows. When a crystal of a nitride semiconductor such as gallium nitride (GaN) is grown on a starting substrate made of sapphire, silicon (Si) or the like and then cooled to the ordinary temperature, a large number of dislocations and cracks occur in the nitride semiconductor layer because of stress caused by the difference in thermal expansion coefficient or lattice constant.

If a large number of dislocations and cracks occur in the growth layer (nitride semiconductor layer) as described above, lattice defects or a large number of dislocations, deformations, cracks, etc., occur in a device when the device is formed on the growth layer. This causes deterioration of device characteristic. Moreover, when the starting substrate is removed while only the growth layer is left as an independent substrate (crystal), it is impossible to produce a large-area crystal because of the function of the dislocations, cracks, etc. In addition, when a thick film is grown, cracks occur in the target single crystal even during the growth. There arises very easily the problem that peeling into small pieces occurs partially.

SUMMARY OF THE INVENTION

The invention is developed to solve the problem and an object of the invention is to obtain a good-quality semiconductor crystal independent of a starting substrate.

According to the present invention, there is provided a method of producing a semiconductor crystal of a Group III nitride compound semiconductor and independent of a starting substrate, the method comprising:

laminating a seed monolayer or multilayer on the starting substrate;

chemically or physically etching part of a seed layer-forming surface of the starting substrate to thereby partially or dispersively leave the seed layer as non-etched portions on the starting substrate;

growing the semiconductor crystal on exposed surfaces of the non-etched portions of the seed layer as initial crystal growth surfaces for starting growth of the semiconductor crystal until the crystal growth surfaces are connected to one another by crystal growth so as to be provided as at least one series of approximately flat surfaces; and breaking the non-etched portions to thereby separate the semiconductor crystal from the starting substrate;

wherein the crystal growing step is performed by a halide vapor phase epitaxy method in the condition that supply ratio of a Group V material to a Group III material is in a range of from 30 to 80, both inclusively.

DETAILED DESCRIPTION OF THE PREFERRED EMBODIMENTS

According to the present invention, as first means, there is provided a methods of producing a semiconductor crystal as a good-quality semiconductor crystal A independent of a starting substrate by growing a semiconductor crystal of a Group III nitride compound semiconductor on the starting substrate, the method including: the seed laminating step of laminating a seed monolayer or multilayer on the starting substrate; the non-etched portion forming step of chemically or physically etching part of a seed layer-forming surface of the starting substrate to thereby partially or dispersively leave the seed layer as non-etched portions on the starting substrate; the crystal growing step of growing the semiconductor crystal A on exposed surfaces of the non-etched portions of the seed layer as initial crystal growth surfaces for starting growth of the semiconductor crystal A until the crystal growth surfaces are connected to one another by crystal growth so as to be provided as at least one series of approximately flat surfaces; and the separating step of breaking the non-etched portions to thereby separate the semiconductor crystal A from the starting substrate; wherein the crystal growing step is performed by a halide vapor phase epitaxy method in the condition that a so-called V/III ratio is in a range of from 30 to 80, both inclusively.

Incidentally, the term "Group III nitride compound semiconductor" used herein generally includes a semiconductor of any mixed crystal ratio represented by the general formula "$Al_{1-x-y}Ga_yIn_xN$; $0 \leq x \leq 1$, $0 \leq y \leq 1$, $0 \leq 1-x-y \leq 1$" which includes binary compounds, ternary compounds, and quaternary compounds. A semiconductor containing p-type or n-type impurities as additives also belongs to the category of "Group III nitride compound semiconductor" in this specification. A semiconductor in which at least part of the Group III elements (such as Al, Ga, and In) are replaced by boron (B), thallium (Tl), etc. or at least part of the nitrogen (N) is replaced by phosphorus (P), arsenic (As), antimony (Sb), bismuth (Bi), etc. also belongs to the category of "Group III nitride compound semiconductor" in this specification. For example, magnesium (Mg), calcium (Ca) or the like may be added as the p-type impurities. For example, silicon (Si), sulfur (S), selenium (Se), tellurium (Te), germanium (Ge) or the like may be added as the n-type impurities. Two or more elements may be added simultaneously as these impurities or the two types (p-type and n-type) of impurities may be added simultaneously.

Examples of the material of the starting substrate include sapphire, spinel, manganese oxide, gallium lithium oxide (LiGaO$_2$), molybdenum sulfide (MoS), silicon (Si), silicon carbide (SiC), AlN, GaAs, InP, GaP, MgO, ZnO, and MgAl$_2$O$_4$. That is, known or optional crystal growth substrates useful for crystal growth of Group III nitride compound semiconductor can be used as these starting substrate materials.

Incidentally, it is more preferable from the point of view of reaction with GaN, thermal expansion coefficient difference and stability at a high temperature that sapphire is selected as the material of the starting substrate.

When a target semiconductor crystal A of a Group III nitride compound semiconductor is grown on a starting substrate having a large number of non-etched portions, the starting substrate and the semiconductor crystal A are connected to each other by only the non-etched portions. For this reason, if the thickness of the semiconductor crystal A is made sufficiently large, internal or external stress can be easily concentrated to act on the non-etched portions. As a result, particularly the stress acts as shear stress on the non-etched portions, so that the non-etched portions are broken when the stress becomes high.

That is, when the stress is used according to the means according to the invention, the starting substrate and the semiconductor crystal A can be easily separated (peeled) from each other. The single crystal (semiconductor crystal A) independent of the starting substrate can be obtained by this means.

Furthermore, when the non-etched portions are formed as described above and the semiconductor crystal is grown laterally, distortion based on the difference between the lattice constant of the starting substrate and the lattice constant of the semiconductor crystal A hardly occurs so that the "stress based on the difference between the lattice constant of the starting substrate and the lattice constant of the semiconductor crystal A" is relaxed. Accordingly, when the required semiconductor crystal A is grown, unnecessary stress acting on the semiconductor crystal A during the growth is suppressed so that the density of occurrence of dislocations and cracks is reduced.

Incidentally, the "large number of non-etched portions" means that the number of non-etched portions is "large" when at least viewed from a vertical section as shown in FIG. 1B. The large number of non-etched portions may be united into one in plan view. Accordingly, even in the case where the large number of non-etched portions are shaped like rectangular waves or precipitous sine waves one-dimensionally united into one or formed as spirally striped non-etched portions in plan view, the function and effect of the invention can be obtained. Furthermore, even in the case where the non-etched portions are formed as islands or dots of any other plan shape such as a nearly circular shape, a nearly elliptic shape, a nearly polygonal shape or a nearly regular polygonal shape than the striped shape, it is a matter of course that the function and effect of the invention can be obtained.

When the starting substrate and the semiconductor crystal A are separated (peeled) from each other, part of the semiconductor crystal A may be left on the starting substrate side, or part (e.g., the broken rest of the non-etched portions) of the starting substrate may be left on the semiconductor crystal A side. That is, the separating step is not performed on the assumption (necessary condition) that the respective materials are separated so completely that the remains of part of these materials are not left.

According to the halide vapor phase epitaxy method in which Group III elements are arranged as metal and supplied to a substrate through hydrogen halide, very high-speed epitaxial growth can be achieved so that a thick film of the semiconductor crystal A can be obtained easily. In this case, when the V/III ratio is selected to be in a range of from 30 to 80, both inclusively, the thick film of the semiconductor crystal A free from cracks can be obtained. The term "V/III ratio" means the supply ratio of a Group V material to a Group III material. When the V/III ratio is 30, 1 mol of Group III atoms are supplied while 30 mol of Group V atoms are supplied. The V/III ratio is selected to be preferably in a range of from 30 to 80, both inclusively, more preferably in a range of from 40 to 70, both inclusively, further preferably in a range of from 50 to 60, both inclusively. If the V/III ratio is lower than 30, a large number of cracks occur. It is conceived that the reason is that stress is hardly concentrated during epitaxial growth as well as the mechanical strength of the semiconductor crystal A varies because vacancies of Group V, that is, mainly of nitrogen are generated in the semiconductor crystal A on the basis of shortage of supply of Group V, that is, mainly of nitrogen. If the V/III ratio is higher than 80, the amount of Group V, that is, mainly of nitrogen becomes so excessive that the growth of the semiconductor crystal A becomes slow because a waste of the Group V material, that is, mainly of the nitrogen material occurs as well as appropriate lateral and vertical epitaxial growth is not obtained.

As second means, the thickness of the semiconductor crystal A in the crystal growing step in the first means is not smaller than 50 $\mu$m. The thickness of the target semiconductor crystal A subjected to crystal growth is preferably selected to be not smaller than about 50 $\mu$m. As the thickness increases, the semiconductor crystal A can be strengthened and the shear stress can be concentrated onto the non-etched portions more easily. Because the peeling phenomenon can be generated on the basis of the difference in lattice constant by these functions even in a high-temperature state during the crystal growth, stress caused by the difference in thermal expansion coefficient little acts on the semiconductor crystal A after peeling. Accordingly, dislocations and cracks can be prevented, so that a high-quality semiconductor crystal A (e.g., GaN single crystal) can be obtained. More preferably, the thickness of the semiconductor crystal A is selected to be not smaller than 70 $\mu$m.

As third means, in the first or second means, the semiconductor crystal A and the starting substrate are cooled or heated to generate stress based on the difference between the thermal expansion coefficient of the semiconductor crystal A and the thermal expansion coefficient of the starting substrate to break the non-etched portions by the stress. That is, the breaking (peeling) may be performed by stress (shear stress) based on the difference between the thermal expansion coefficient of the semiconductor crystal A and the thermal expansion coefficient of the starting substrate. According to this means, particularly when the semiconductor crystal A is formed to have a thickness of not smaller than 50 $\mu$m, the semiconductor crystal A and the starting substrate can be separated from each other surely while the crystallinity of the semiconductor crystal A is kept high.

As fourth means, in any one of the first to third means, the seed monolayer or the uppermost layer of the seed multilayer is made of gallium nitride (GaN). As a specific composition of the semiconductor crystal A, it is conceived at present that gallium nitride (GaN) most suitable for a semiconductor crystal growth substrate and very useful has the highest value in industrial use. Accordingly, in this case, when the seed monolayer or the uppermost layer of the seed multilayer is made of gallium nitride (GaN), the crystal growth of the target semiconductor crystal A (GaN single crystal) can be performed best. Incidentally, AlGaN, AlGaInN or the like may be selected as a more specific composition of the semiconductor crystal A because it is a matter of course that the value of AlGaN, AlGaInN or the like in industrial use is high. Also when AlGaN, AlGaInN or the like is selected, the seed monolayer or the uppermost layer of the seed multilayer is preferably made of a semiconductor (Group III nitride compound semiconductor) relatively near or substantially equal in composition to the target single crystal (semiconductor crystal layer A).

As fifth means, in any one of the first to fourth means, the seed monolayer or the lowermost layer of the seed multilayer is made of aluminum nitride (AlN). Accordingly, because a so-called buffer layer can be made of aluminum nitride (AlN), a known function based on lamination of the buffer layer (AlN) can be obtained. That is, a known functional theory that stress caused by the difference in lattice constant and acting on the target semiconductor crystal layer A can be relaxed makes it easy or possible to improve the crystallinity of the target semiconductor crystal layer A.

According to this means, stress between the AlN buffer layer and the starting substrate can be made higher, so that the starting substrate can be separated more easily. The multilayer structure of the seed layer is very effective in obtaining the aforementioned function and effect sufficiently. For example, the seed layer may be formed from two layers including an AlN buffer layer (first seed layer) as its lower layer, and a GaN layer (second seed layer) as its upper layer. According to this combination, the functions and effects of the fourth and fifth means can be obtained simultaneously.

As sixth means, in any one of the first to fifth means, the interval for arrangement of the non-etched portions in the non-etched portion forming step is selected to be in a range of from 1 $\mu$m to 50 $\mu$m, both inclusively. More preferably, the interval for arrangement of the non-etched portions is selected to be in a range of from about 5 $\mu$m to about 30 $\mu$m though it depends on the condition for carrying out crystal growth. Incidentally, the term "interval for arrangement" means the distance between centers of adjacent ones of the non-etched portions.

By this means, trough portions between the non-etched portions can be covered with the semiconductor crystal A. If the interval is too large, the trough portions between the non-etched portions cannot be surely covered with the semiconductor crystal A so that good-quality crystal (semiconductor crystal A) of uniform crystallinity cannot be obtained. If the interval is further too large, displacement in crystal orientation becomes remarkable, undesirably.

When S is the lateral thickness, width or diameter of the top portion of each non-etched portion and L is the interval for arrangement (arrangement period), the value of S/L is preferably selected to be in arrange of from about 1/4 to about 1/6. By this setting, the epitaxially lateral growth (ELO) of the required semiconductor crystal A can be accelerated sufficiently to obtain a high-quality single crystal. When W(=L−S) is the distance between facing side walls of adjacent ones of the non-etched portions, each region between the facing side walls (that is, each region including an etched concave portion and its upper portion) may be hereinafter referred to as "wing". The width S of each non-etched portion may be hereinafter referred to as "seed width". Accordingly, the ratio S/W of the seed width to the wing width is preferably selected to be in a range of from about 1/3 to about 1/5.

Preferably, the etching is performed so that the non-etched portions are arranged at approximately regular intervals or at approximately fixed periods. As a result, the growth condition for lateral growth becomes approximately uniform as a whole, so that the crystallinity or grown film thickness can be prevented from becoming uneven. Because local variation can be prevented until the trough portions between the non-etched portions are covered with the semiconductor crystal A completely, accurate, early, and unique decision of the timing for changing the crystal growth method can be made easily when the crystal growth method is changed partway from a crystal growth method slow in crystal growth rate to a crystal growth method high in crystal growth rate. Furthermore, by this means, the shear stress can be divided into the non-etched portions approximately equally. Accordingly, all the non-etched portions are broken evenly, so that the starting substrate and the semiconductor crystal A can be separated from each other surely.

Accordingly, for example, the non-etched portions may be formed as striped mesa portions so that the striped mesa portions are arranged isotropically at regular intervals. The formation of such non-etched portions has a merit that it can be performed easily and surely in view of the present situation of the level of existing general etching technology. In this case, the direction of mesa (non-etched portions) may be preferably <1-100> or <11-20> of semiconductor crystal.

A method in which the non-etched portions are formed on lattice points of a two-dimensional triangular lattice based on nearly equilateral triangles 0.1 $\mu$m or more on a side is also effective. According to this method, the area of contact with the starting substrate can be reduced, so that the starting substrate can be separated easily as well as the number of dislocations can be reduced surely on the basis of the aforementioned function.

A method in which the lateral sectional shape of each non-etched portion is formed into a nearly equilateral triangle, a nearly regular hexagon, nearly a circle, or a quadrangle is also effective. By this method, the directions of crystal axes of portions of the crystal formed of the Group III nitride compound semiconductor are apt to be equal or the lateral length (thickness) of the non-etched portions can be limited to be substantially uniform with respect to any lateral direction. As a result, the number of dislocations can be suppressed. Particularly, a regular hexagon or an equilateral triangle may be more preferably selected because the shape of the regular hexagon or the equilateral triangle can be easily matched with the crystal structure of the semiconductor crystal. On the other hand, a circle or a quadrangle has a merit that the shape of the circle or the quadrangle can be formed easily from the point of view of manufacturing technique in view of the present situation of the level of existing general etching technology.

As seventh means, the starting substrate is etched by 0.01 $\mu$m or deeper. When up to part of the starting substrate is etched as described above, it is easy to form a "cavity" on a side of each non-etched portion as well as it is easier to flatten the surface (crystal growth surface) of the target semiconductor crystal A in the following crystal growing step. As the "cavities" are formed largely, stress (shear stress) can be concentrated onto the non-etched portions easily.

As eighth means, in any one of the first to seventh means, the lateral thickness, width or diameter of each of the non-etched portions in the non-etched portion forming step is selected to be in a range of from 0.1 μm to 20 μm, both inclusively. More preferably, the lateral thickness, width or diameter of each of the non-etched portions is selected to be in a range of from about 0.5 μm to about 10 μm though it depends on the condition for carrying out the crystal growth. If the thickness is too large, the influence of stress acting on the semiconductor crystal A becomes large on the basis of the difference in lattice constant so that the number of dislocations in the semiconductor crystal A is apt to increase. If the thickness is too small, the non-etched portions per se can be hardly formed or the crystal growth rate b of the top portions of the non-etched portions becomes low, undesirably.

Furthermore, if the lateral thickness, width or diameter of each of the non-etched portions is too large when the non-etched portions are to be broken by stress (shear stress), the non-etched portions cannot be broken surely, undesirably, because the area of contact with the starting substrate becomes large. The influence of stress acting on the semiconductor crystal A on the basis of the difference in lattice constant depends not only on the lateral thickness (length) of each of the non-etched portions but also on the interval for arrangement of the non-etched portions. If these setting ranges are unsuitable, the influence of stress based on the difference in lattice constant becomes so large that the number of dislocations in the semiconductor crystal A is apt to increase undesirably.

Furthermore, because there is an optimal value or a proper range in the lateral thickness, width or diameter of each of the top portions of the non-etched portions as described above, the shape of the top surface, the bottom surface or the lateral section of each of the non-etched portions may be formed as an at least locally closed shape (island shape). Preferably, the shape may be formed as an outward convexly closed shape More preferably, the shape of the top surface, the bottom surface or the lateral section of each of the non-etched portions may be formed as nearly a circle or a nearly regular polygon. By this setting, the optimal value or the proper range can be achieved easily and surely with respect to any lateral direction.

As ninth means, in any one of the first to eighth means, there is further provided the rest removing step of removing the broken rest of the non-etched portions remaining on a rear surface of the semiconductor crystal A by a chemical or physical process such as etching at least after the separating step According to this means, when an electrode for a semiconductor light-emitting element or the like is formed on a rear surface of the semiconductor crystal A (a surface from which the starting substrate is separated), electric current irregularity and electric resistance generated in the neighborhood of the interface between the electrode and the semiconductor crystal A can be suppressed. Accordingly, reduction in drive voltage or improvement in light-emitting intensity can be attained.

Furthermore when the electrode is also used as a reflecting mirror for a semiconductor light-emitting element or the like, absorption or scattering of light is reduced near the mirror surface because the broken rest of the non-etched portions is removed. As a result, reflectance is improved, so that light-emitting intensity is improved. When, for example, the rest removing step is performed by a physical process such as polishing, up to the buffer layer on the rear surface of the semiconductor crystal A can be removed or the flatness of the rear surface of the semiconductor crystal A can be improved. Accordingly, the function and effect such as suppression of electric current irregularity and electric resistance or reduction in absorption or scattering of light near the mirror surface can be strengthened more greatly.

Incidentally, the process may be a heating process. When the sublimation temperature of the portions to be removed is lower than the sublimation temperature of the target semiconductor crystal A, the unnecessary portions can be also removed by a heating process or by laser irradiation.

As tenth means, there is provided a Group III nitride compound semiconductor light-emitting element in which a semiconductor crystal produced by a semiconductor crystal producing method according to any one of the first to ninth means is used as a crystal growth substrate. According to this means, it is possible or easy to produce a Group III nitride compound semiconductor light-emitting element from a semiconductor good in crystallinity and low in internal stress.

As eleventh means, there is provided a Group III nitride compound semiconductor light-emitting element produced by crystal growth in which a semiconductor crystal produced by a semiconductor crystal producing method according to any one of the first to ninth means is used as a crystal growth substrate. According to this means, it is possible or easy to produce a Group III nitride compound semiconductor light-emitting element from a semiconductor good in crystallinity and low in internal stress.

Incidentally, when the seed layer is provided as a multilayer, a buffer layer of "$Al_xGa_{1-x}N$ ($0 \leq x < 1$)" is preferably formed as the first laminated semiconductor layer. Incidentally, an intermediate layer provided separately from the buffer layer and having substantially the same composition (e.g., AlN or AlGaN) as the buffer layer may be laminated periodically or alternately with the other layer or so as to form a multilayer structure. By the lamination of the buffer layer (or the intermediate layer), stress caused by the difference in lattice constant and acting on the semiconductor crystal A can be relaxed. That is, crystallinity can be improved on the basis of the same functional theory as in the related art.

When the starting substrate and the semiconductor crystal A are cooled in the separating step, there is preferably used a method in which the starting substrate and the semiconductor crystal A are cooled to approximately the ordinary temperature at a cooling rate of "from –100° C./min to –0.5° C./min" approximately in the condition that the starting substrate and the semiconductor crystal A are left in a reaction chamber of a growth apparatus while an approximately fixed flow rate of ammonia ($NH_3$) gas is imported into the reaction chamber. For example, by this method, the separating step can be performed surely while the crystallinity of the semiconductor crystal A is kept stable and good.

According to the means of the invention, the problem can be solved effectively or reasonably.

The invention will be described below on the basis of a specific embodiment thereof. Incidentally, the invention is not limited to the following embodiment.

In this embodiment, a seed layer (Group III nitride compound semiconductor) as a laminate of a first seed layer (AlN buffer layer 102) and a second seed layer (GaN layer 103) was formed by vapor phase growth according to a metal organic vapor phase epitaxy method (hereinafter referred to as "MOVPE"). The gases used in the vapor phase growth were ammonia ($NH_3$), carrier gas ($H_2$ or $N_2$), trimethyl gallium ($Ga(CH_3)_3$, hereinafter referred to as "TMG"), and trimethyl aluminum ($Al(CH_3)_3$, hereinafter referred to as "TMA").

1. Seed Laminating Step:

FIGS. 1A to 1D are typical sectional views of a semiconductor crystal for explaining a process for producing a semiconductor crystal according to this embodiment. First, a sapphire substrate 101 (starting substrate) about 250 μm thick and 1 inch square was cleaned by means of organic cleansing and heating (baking). In the condition that a face a of the single-crystal starting substrate 101 was used as a crystal growth surface, 10 l/min of $H_2$, 5 l/min of $NH_3$ and 20 μmol/min of TMA were supplied for performing crystal growth to obtain an AlN buffer layer 102 (first seed layer) about 200 nm thick. Incidentally, the temperature used for the crystal growth in this case was about 400° C.

The sapphire substrate 101 was further heated to 1000° C. In this condition, 20 l/min of $H_2$, 10 l/min of $NH_3$ and 300 μmol/min of TMG were introduced for forming a GaN layer 103 (second seed layer) about 1.5 μm thick (FIG. 1A).

2. Non-Etched Portion Forming Step:

Then, a hard-bake resist mask was used so that striped non-etched portions arranged at intervals of L≈20 μm were formed by selective dry etching using reactive ion etching (RIE) (FIG. 1B). That is, the substrate was etched by about 0.1 μm depth in the form of stripes with a stripe width (seed width S) of about 5 μm and a wing width W of about 15 μm to thereby form non-etched portions each substantially shaped like a rectangle in sectional. The resist mask was formed so that the side wall of each of the striped non-etched portions would be provided as a {11-20} face of the GaN layer 103 (second seed layer). By this etching, the striped non-etched portions were formed substantially periodically so that the seed layer being a laminate of the GaN layer 103 (second seed layer) and the AlN buffer layer 102 (first seed layer) was provided as a flat top portion of each of the striped non-etched portions. As a result, part of the sapphire substrate 101 was exposed in trough portions of wings.

3. Crystal Growing Step:

Then, exposed surfaces of the striped non-etched portions were used as initial crystal growth surfaces so that a target semiconductor crystal A as a GaN single crystal was formed by an HVPE method.

The target semiconductor crystal A was finally grown to have a thickness of about 250 μm. At the initial stage of the crystal growth, GaN was grown both laterally and vertically. After respective GaN crystal portions were once connected so as to be flattened to a series of nearly flat surfaces, the GaN crystal was grown vertically. A lateral HVPE apparatus was used in the HVPE method. Ammonia ($NH_3$) was used as a Group V material. GaCl prepared by reaction of Ga and HCl was used as a Group III material.

In this manner, after sides of the seed layer were filled with the GaN crystal mainly grown laterally epitaxially, the target semiconductor crystal A (GaN single crystal) having a required thickness was obtained by vertical growth (FIG. 1C). Incidentally, in FIG. 1C, the reference sign R designates a "cavity". Incidentally, in the condition, when the thickness of GaN exceeds 250 μm, peeling is observed near the AlN buffer layer 102 (first seed layer) in the crystal growing step. The peeling is caused by the difference between lattice constants. Accordingly, the following separating step can be omitted. In this case, because peeling can be performed at a high temperature, defects can be prevented from being caused by the difference between thermal expansion coefficients at the time of cooling.

4. Separating Step:

The semiconductor crystal A was cooled slowly from 1100° C. to approximately the room temperature at a cooling rate of 1.5° C./min. As a result, peeling occurred near the AlN buffer layer 102 (first seed layer), so that the semiconductor crystal A (GaN single crystal) having a required thickness was obtained independent of the starting substrate 101 (FIG. 1D).

Semiconductor crystals A obtained when the V/III ratio was changed in the "3. crystal growing step" were evaluated as follows.

Case of V/III Ratio of 20

Supply amounts were 50 sccm (standard cubic centimeters). of HCl, 1000 sccm of $NH_3$ and 6000 sccm of carrier gas. In this case, a large number of cracks were observed.

Case of V/III Ratio of 30

Supply amounts were 50 sccm (standard cubic centimeters) of HCl, 1500 sccm of $NH_3$ and 5500 sccm of carrier gas. In this case, the upper surface of the semiconductor crystal A was substantially a mirror surface but a small number of cracks were observed.

Case of V/III Ratio of 40

Supply amounts were 50 sccm (standard cubic centimeters) of HCl, 2000 sccm of $NH_3$ and 5000 sccm of carrier gas. In this case, the upper surface of the semiconductor crystal A was substantially a mirror surface and there was no crack observed.

Case of V/III Ratio of 50

Supply amounts were 50 sccm (standard cubic centimeters) of HCl, 2500 sccm of $NH_3$ and 4500 sccm of carrier gas. In this case, the upper surface of the semiconductor crystal A was substantially a mirror surface and there was no crack observed.

Incidentally, an intermediate layer provided separately from the buffer layer and having substantially the same composition (e.g., AlN or AlGaN) as that of the buffer layer may be laminated periodically or alternately with the other layer or so as to form a multilayer structure. By the lamination of the buffer layer (or the intermediate layer), stress caused by the difference in lattice constant and acting on the semiconductor crystal A can be relaxed. That is, crystallinity can be improved on the basis of the same functional theory as in the related art.

When the starting substrate and the semiconductor crystal A are cooled in the separating step, there may be also used a method in which the starting substrate and the semiconductor crystal A are cooled to approximately the ordinary temperature at a cooling rate of "from –100° C./min to –0.5° C./min" approximately in the condition that the starting substrate and the semiconductor crystal A are left in a reaction chamber of a growth apparatus while an approximately fixed flow rate of ammonia ($NH_3$) gas is imported into the reaction chamber. If the cooling rate is too high, there is fear that breaks or cracks may occur in the semiconductor crystal A.

This invention is not at all limited to the description of the mode for carrying out the invention. This invention includes various modifications that can be conceived easily by those skilled in the art, without departing from the scope of claim.

What is claimed is:

1. A method of producing a semiconductor crystal of a Group III nitride compound semiconductor, said method comprising:

laminating a seed monolayer or multilayer on a starting substrate;

chemically or physically etching part of a seed layer-forming surface of said starting substrate to thereby partially or dispersively leave said seed layer as a plurality of non-etched portions on said starting substrate;

growing said semiconductor crystal on exposed surfaces of said non-etched portions of said seed layer as initial crystal growth surfaces for starting growth of said semiconductor crystal until said crystal growth surfaces are connected to one another by crystal growth so as to be provided as at least one series of approximately flat surfaces; and breaking said non-etched portions to thereby separate said semiconductor crystal from said starting substrate, wherein the crystal growing is performed by a halide vapor phase epitaxy method in the condition that a supply ratio of a Group V material to a Group III material is in a range of from 30 to 80, both inclusively.

2. A method of producing a semiconductor crystal according to claim 1, wherein a thickness of said semiconductor crystal in the crystal growing step is not smaller than 50 $\mu$m.

3. A method of producing a semiconductor crystal according to claim 1, wherein said semiconductor crystal and said starting substrate are cooled or heated to generate stress based on a difference between a thermal expansion coefficient of said semiconductor crystal and a thermal expansion coefficient of said starting substrate to break said non-etched portions by said stress.

4. A method of producing a semiconductor crystal according to claim 1, wherein said seed monolayer or an uppermost layer of said seed multilayer comprises gallium nitride (GaN).

5. A method of producing a semiconductor crystal according to claim 1, wherein said seed monolayer or a lowermost layer of said seed multilayer comprises aluminum nitride (AlN).

6. A method of producing a semiconductor crystal according to claim 1, wherein an interval for arrangement of said non-etched portions in the non-etched portion forming is selected to be in a range of from 1 $\mu$m to 50 $\mu$m, both inclusively.

7. A method of producing a semiconductor crystal according to claim 1, wherein said starting substrate is etched by 0.01 $\mu$m or deeper in the non-etched portion forming.

8. A method of producing a semiconductor crystal according to claim 1, wherein a lateral thickness, width or diameter of each of said non-etched portions in the non-etched portion forming is selected to be in a range of from 0.1 $\mu$m to 20 $\mu$m, both inclusively.

9. A method of producing a semiconductor crystal according to claim 1, further comprising removing the broken rest of said non-etched portions remaining on a rear surface of said semiconductor crystal by a chemical or physical process at least after the separating.

10. The method of claim 9, wherein said chemical or physical process comprises etching.

* * * * *